United States Patent
Watanabe et al.

(10) Patent No.: US 9,758,902 B2
(45) Date of Patent: Sep. 12, 2017

(54) METHOD FOR PRODUCING 3C-SIC EPITAXIAL LAYER, 3C-SIC EPITAXIAL SUBSTRATE, AND SEMICONDUCTOR DEVICE

(71) Applicant: SEIKO EPSON CORPORATION, Tokyo (JP)

(72) Inventors: Yukimune Watanabe, Hokuto (JP); Noriyasu Kawana, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/514,993

(22) Filed: Oct. 15, 2014

(65) Prior Publication Data

US 2015/0108504 A1 Apr. 23, 2015

(30) Foreign Application Priority Data

Oct. 17, 2013 (JP) .................................. 2013-216306

(51) Int. Cl.
| | |
|---|---|
| *H01L 29/16* | (2006.01) |
| *H01L 21/02* | (2006.01) |
| *C30B 25/18* | (2006.01) |
| *C30B 29/36* | (2006.01) |

(52) U.S. Cl.
CPC .......... *C30B 25/183* (2013.01); *C30B 25/186* (2013.01); *C30B 29/36* (2013.01); *H01L 21/0262* (2013.01); *H01L 21/02381* (2013.01); *H01L 21/02447* (2013.01); *H01L 21/02529* (2013.01); *H01L 21/02598* (2013.01); *H01L 21/02658* (2013.01); *H01L 29/1608* (2013.01)

(58) Field of Classification Search
CPC ...................... H01L 29/1608; H01L 21/02447
USPC ............................................ 257/77; 117/95
See application file for complete search history.

(56) References Cited

U.S. PATENT DOCUMENTS

| | | | | |
|---|---|---|---|---|
| 5,403,673 A | * | 4/1995 | Haga | ..................... H05B 33/22 257/E31.052 |
| 6,273,950 B1 | * | 8/2001 | Kitabatake | .............. C30B 33/00 117/95 |
| 6,391,799 B1 | * | 5/2002 | Di Cioccio | ......... H01L 21/0475 257/E21.06 |
| 2001/0015170 A1 | * | 8/2001 | Kitabatake | .............. C30B 33/00 117/95 |
| 2002/0137249 A1 | * | 9/2002 | Ishida | ................. H01L 21/0237 438/47 |
| 2003/0040167 A1 | * | 2/2003 | Nagasawa | ............... C30B 25/02 438/486 |
| 2004/0053438 A1 | * | 3/2004 | Abe | ....................... C30B 25/02 438/93 |

(Continued)

FOREIGN PATENT DOCUMENTS

| | | |
|---|---|---|
| JP | H09-321323 A | 12/1997 |
| JP | A-11-186178 | 7/1999 |

(Continued)

*Primary Examiner* — Moazzam Hossain
(74) *Attorney, Agent, or Firm* — Oliff PLC

(57) ABSTRACT

A 3C-SiC epitaxial layer is produced by a production method including: epitaxially growing a first 3C-SiC layer on a Si substrate; oxidizing the first 3C-SiC layer; removing an oxide film on a surface of the 3C-SiC layer; and epitaxially growing a second 3C-SiC layer on the 3C-SiC layer after the oxide film is removed.

2 Claims, 2 Drawing Sheets

(56) References Cited

U.S. PATENT DOCUMENTS

| | | | |
|---|---|---|---|
| 2006/0011128 A1* | 1/2006 | Ellison | C30B 25/02 117/84 |
| 2007/0051301 A1 | 3/2007 | Hirooka | |
| 2009/0039361 A1* | 2/2009 | Li | H01L 21/02381 257/94 |
| 2009/0315941 A1* | 12/2009 | Kojima | B41J 2/1652 347/22 |
| 2011/0079793 A1* | 4/2011 | Shimada | C30B 25/183 257/77 |
| 2011/0089433 A1* | 4/2011 | Kawamura | C30B 25/02 257/77 |
| 2011/0309376 A1* | 12/2011 | Hiyoshi | H01L 21/02043 257/77 |
| 2012/0021173 A1* | 1/2012 | Shimada | C30B 25/02 428/137 |
| 2012/0056194 A1* | 3/2012 | Dimitrijev | H01L 21/02381 257/77 |
| 2012/0070968 A1* | 3/2012 | Shibagaki | H01L 21/0445 438/522 |
| 2012/0208368 A1* | 8/2012 | Masuda | H01L 21/049 438/703 |
| 2013/0009301 A1* | 1/2013 | Iwayama | C22C 1/1068 257/706 |
| 2013/0221377 A1* | 8/2013 | Ward | C30B 25/183 257/77 |
| 2014/0220299 A1* | 8/2014 | Yoshida | C30B 29/36 428/141 |
| 2015/0206743 A1* | 7/2015 | Ward | H01L 21/02381 257/77 |

FOREIGN PATENT DOCUMENTS

| | | |
|---|---|---|
| JP | A-2002-201098 | 7/2002 |
| JP | 2005-286038 A | 10/2005 |
| JP | 2008-024554 A | 2/2008 |
| JP | 2012-031012 A | 2/2012 |
| WO | 2006-090432 A1 | 8/2006 |

* cited by examiner

US 9,758,902 B2

METHOD FOR PRODUCING 3C-SIC EPITAXIAL LAYER, 3C-SIC EPITAXIAL SUBSTRATE, AND SEMICONDUCTOR DEVICE

CROSS-REFERENCE TO RELATED APPLICATION

This application claims a priority to Japanese Patent Application No. 2013-216306 filed on Oct. 17, 2013 which is hereby expressly incorporated by reference in its entirety.

BACKGROUND

1. Technical Field

Several aspects of the present invention relate to a method for producing a 3C-SiC epitaxial layer and a semiconductor device.

2. Related Art

SiC is a wide gap semiconductor having a band gap twice or more wider than that of Si, and is expected to be used as a material for, for example, a high voltage device. SiC has many polytypes, and as representative polytypes, a hexagonal 4H-SiC polytype, a hexagonal 6H-SiC polytype, and a cubic 3C-SiC polytype are known. These polytypes have different electrical characteristics, and therefore, are expected to be used for different applications.

SiC is a material having a high melting point, and it is difficult to produce a single crystal substrate. Due to this, in the production of a SiC device, heteroepitaxial growth of SiC on a Si substrate has been examined. However, when heteroepitaxial growth of SiC on a Si substrate is performed, the growth temperature is around 1350° C., which is very high and close to the melting point (1420° C.) of silicon. Therefore, when the temperature of a Si substrate is increased to the growth temperature, Si sublimes from the surface of the substrate, and epitaxial growth cannot be performed normally. As measures for this, a technique for carbonizing the surface of a Si substrate to prevent sublimation is known. On the carbonized Si substrate, SiC can be epitaxially grown.

However, the lattice constants of Si and 3C-SiC are 5.43 Å and 4.36 Å, respectively, and there is an about 20% difference. Due to this, many crystal defects are formed at a boundary surface between 3C-SiC and Si, and the formed defects propagate to a 3C-SiC epitaxial layer. In order to improve the quality of the epitaxial layer, and further to improve the characteristics of the device, it is necessary to reduce the crystal defects in the epitaxial layer. Further, internal stress caused by a difference in lattice constant and a difference in thermal expansion coefficient, a problem occurs such that the substrate is bowed into a downward convex shape or a crack occurs. When an electronic device is produced on a surface of a substrate, bowing of the substrate or a crack becomes an obstacle to the production process.

JP-A-11-186178 (PTL 1) discloses a technique for forming a pattern in a non-growth region formed on a substrate or a laminated layer in the form of a dot, a stripe, a lattice, or the like in order to prevent bowing of a substrate or a crack.

The technique disclosed in PTL 1 requires multiple processing steps such as an oxide film forming step, a patterning step using a photomask, and an etching step for forming a pattern in a non-growth region, and therefore, a processing cost is increased. Further, according to the technique disclosed in PTL 1, bowing of a substrate is reduced, however, there is still a room for improvement.

SUMMARY

An advantage of some aspects of the invention is to provide a method for producing a 3C-SiC epitaxial layer in which bowing of a substrate is reduced and crystal quality is improved, and also provides a semiconductor device.

An aspect of the invention provides a method for producing a 3C-SiC epitaxial layer including: epitaxially growing a first 3C-SiC layer on a Si substrate; oxidizing the first 3C-SiC layer; removing an oxide film on a surface of the 3C-SiC layer; and epitaxially growing a second 3C-SiC layer on the 3C-SiC layer after the oxide film is removed.

According to this production method, a 3C-SiC epitaxial layer, in which bowing of a substrate is reduced and also crystal quality is improved, can be formed.

The oxidation may be performed by thermal oxidation at 1100 to 1200° C.

The thermal oxidation may be performed in an oxygen atmosphere.

The thermal oxidation may be performed in an oxygen and steam atmosphere.

The removal of the oxide film may be performed by wet etching.

The Si substrate may be a Si(100) substrate.

Another aspect of the invention provides a 3C-SiC epitaxial substrate including: a Si substrate; a first 3C-SiC epitaxial layer which is formed on the Si substrate and is oxidized; and a second 3C-SiC epitaxial layer formed on the first 3C-SiC epitaxial layer.

According to this epitaxial substrate, the characteristics of a device to be produced can be improved.

This 3C-SiC epitaxial substrate may include a buffer layer between the Si substrate and the first 3C-SiC epitaxial layer.

The buffer layer may be carbonized Si.

The buffer layer may be formed from a cubic crystal material having a lattice constant smaller than that of Si and larger than that of 3C-SiC.

Still another aspect of the invention provides a semiconductor device including anyone of the 3C-SiC epitaxial substrates described above.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
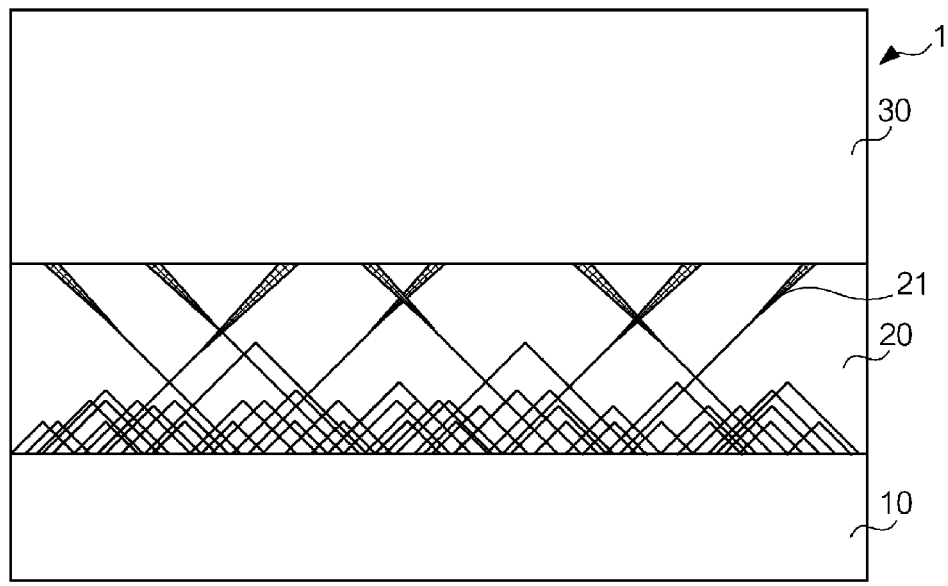
FIG. 1 is a schematic view showing the structure of a 3C-SiC epitaxial substrate 1.

FIG. 1 is a schematic view showing the structure of a 3C-SiC epitaxial substrate 1 according to a first embodiment. FIG. 1 shows a schematic cross-sectional view of the 3C-SiC epitaxial substrate 1. The 3C-SiC epitaxial substrate 1 includes a substrate 10, a SiC epitaxial layer 20, and SiC epitaxial layer 30.

The substrate 10 is a Si substrate. The Si substrate can be obtained by, for example, slicing a Si single crystal ingot grown by the CZ (Czochralski) method to a predetermined thickness, followed by polishing. As the substrate 10, a substrate with a surface of a (100) plane is used. Incidentally, as the substrate 10, a substrate with a surface inclined (or offset) by a predetermined angle (for example, 4°) with respect to the (100) plane, or a substrate with a surface having a plane orientation other than the (100) plane (for example, a (111) plane) may be used. Further, the substrate 10 is not limited to a substrate cut out of a Si ingot. The substrate 10 may be a substrate in which a Si epitaxial layer (single crystal Si film) is formed on a substrate composed of a material other than Si such as quartz, sapphire, or stainless steel. The "Si substrate" as used herein includes both of a substrate cut out of a Si ingot and a substrate in which a Si epitaxial layer is formed on a substrate composed of a material other than Si.

The SiC epitaxial layer 20 is a 3C-SiC epitaxial layer formed on the substrate 10. In the vicinity of the boundary surface between the SiC epitaxial layer 20 and the substrate 10 (3C-SiC/Si boundary surface), many crystal defects are formed due to the effect of stress generated by a difference in lattice constant and a difference in thermal expansion coefficient between 3C-SiC and Si. These crystal defects are stacking faults parallel to the (111) plane. In FIG. 1, these crystal defects are shown by solid lines in the SiC epitaxial layer 20. The crystal defects are formed in the (111) plane and extend in the direction inclined by 54.73° with respect to the [111] direction, that is, the surface of the substrate 10 (Si (100) plane).

As the SiC epitaxial layer is grown to increase the film thickness, the crystal defects are associated with other crystal defects and thereby are annihilated. Due to this, the density of crystal defects decreases toward the upper part of the SiC epitaxial layer 20. However, the crystal defects are never completely annihilated, and even if the SiC epitaxial layer 20 is grown to a certain degree of thickness, crystal defects with a certain density are left.

In the SiC epitaxial layer 20, along with these crystal defects, an oxide film 21 is formed. Due to the volume expansion by the oxidation of SiC, stress is generated in the direction of eliminating the bowing of a substrate. Therefore, by adjusting the thickness of the SiC epitaxial layer 20 and the thickness of the oxide film 21, the bowing of a substrate can be reduced, and therefore, a substantially flat epitaxial substrate can be produced.

The SiC epitaxial layer 30 is a 3C-SiC epitaxial layer formed on the SiC epitaxial layer 20. The SiC epitaxial layer 30 is grown on the SiC epitaxial layer 20 in which the density of crystal defects is decreased as compared with at the 3C-SiC/Si boundary surface, and therefore is a layer (film) having a low crystal defect density and high quality.

On the SiC epitaxial layer 30, a semiconductor device (electronic device) can be produced. Examples of the electronic device formed using the SiC epitaxial layer 30 include transistors (such as MOSFET and MESFET) and diodes (such as a Schottky diode and a pn junction diode).

Figure 2:
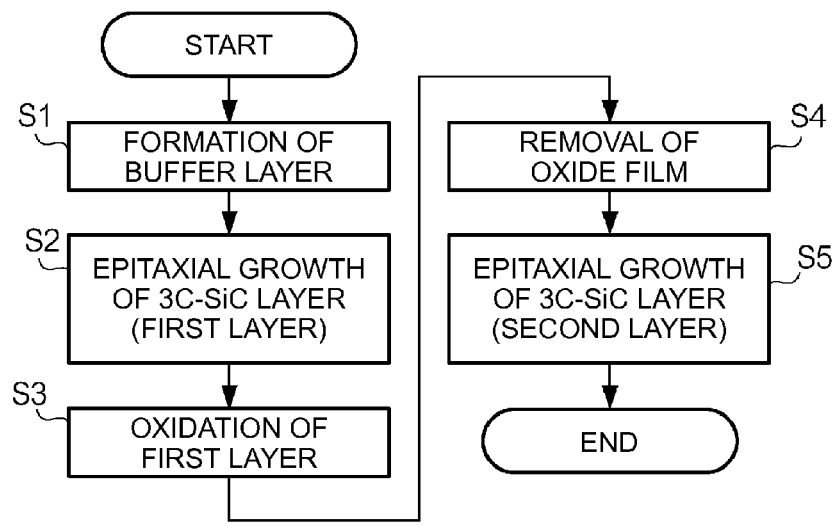
FIG. 2 is a flowchart showing a method for producing the 3C-SiC epitaxial substrate 1.

FIG. 2 is a flowchart showing a method for producing the 3C-SiC epitaxial substrate 1.

In Step S1, a buffer layer (not shown) is formed on the substrate 10. The buffer layer is a layer for easing the difference in lattice constant between the substrate 10 and the epitaxial layer to be grown thereafter. The buffer layer is, for example, a carbonized layer obtained by a carbonization treatment of a Si substrate. In the carbonization treatment of a Si substrate, for example, a cold wall-type UHV-CVD (Ultra High Vacuum-Chemical Vapor Deposition) chamber is used. The base pressure of the UHV-CVD is, for example, $2.0 \times 10^{-7}$ Pa. Before introducing a Si substrate into the UHV-CVD chamber, a predetermined pretreatment is performed. This pretreatment includes, for example, a treatment of removing a natural oxide film on the surface of the Si substrate. The natural oxide film is removed by, for example, washing using a 1% DHF solution. After removing the natural oxide film, the substrate 10 is placed in the chamber.

Subsequently, a carbon source gas (carbonization source gas) is introduced into the UHV-CVD chamber. As the carbon source gas, a hydrocarbon-based gas, for example, methane ($CH_4$), ethane ($C_2H_6$), acetylene ($C_2H_2$), ethylene ($C_2H_4$), propane ($C_3H_8$), normal butane (n-$C_4H_{10}$), isobutane (i-$C_4H_{10}$), neopentane (neo-$C_5H_{12}$), or the like is used. These gasses may be used alone or two or more types thereof may be mixed.

After introducing the carbon source gas, the temperature of the Si substrate is increased to a predetermined carbonization temperature at a predetermined temperature increasing rate (for example, 10° C./min). The carbonization temperature is, for example, in the range of 900 to 1350° C. The Si substrate is maintained at the carbonization temperature for a predetermined carbonization time. The carbonization time is, for example, in the range of 0 to 300 minutes. After the carbonization time elapses, the supply of the carbon source gas is stopped, and the temperature of the Si substrate is decreased to a predetermined standby temperature (for example, 600° C.).

The sequence of this carbonization treatment is an example, and the carbonization treatment is not limited thereto. Further, the buffer layer is not limited to the carbonized layer of the Si substrate. The buffer layer may be formed from any material as long as the material has a cubic crystal structure and the lattice constant thereof is smaller than that of Si and larger than that of 3C-SiC. Further, in another example, the formation of the buffer layer (Step S1) itself may be omitted.

In Step S2, a 3C-SiC epitaxial layer (SiC epitaxial layer 20) is grown on the substrate 10. Here, the case where the SiC epitaxial layer 20 is grown "on the substrate 10" includes not only a case where the SiC epitaxial layer 20 is grown directly on the substrate 10, but also a case where the SiC epitaxial layer 20 is grown on the buffer layer formed on the substrate 10. The thickness of the SiC epitaxial layer 20 is, for example, from 500 nm to 1 μm. The growth of the 3C-SiC epitaxial layer is performed by, for example, CVD (Chemical Vapor Deposition). In the CVD, the epitaxial growth is performed by introducing a raw material gas into the substrate 10 placed in a vacuum chamber.

As the raw material gas of carbon, a hydrocarbon-based gas, for example, methane ($CH_4$), ethane ($C_2H_6$), acetylene ($C_2H_2$), ethylene ($C_2H_4$), propane ($C_3H_8$), normal butane (n-$C_4H_{10}$), isobutane (i-$C_4H_{10}$), neopentane (neo-$C_5H_{12}$), or the like is used. These gasses may be used alone or two or more types thereof may be mixed. Incidentally, the raw material gas of carbon to be used in the epitaxial growth of 3C-SiC may be the same as or different from the carbon source gas to be used in the carbonization treatment of the Si substrate.

As the raw material gas of silicon, a silane-based gas, for example, dichlorosilane ($SiH_2Cl_2$), tetrachlorosilane ($SiCl_4$), trichlorosilane ($SiHCl_3$), hexachlorodisilane ($Si_2Cl_6$), silane ($SiH_4$), disilane ($Si_2H_6$), monomethylsilane ($SiH_3(CH_3)$), dimethylsilane ($SiH_2(CH_3)_2$), trimethylsilan ($SiH(CH_3)_3$) or the like is used. These gasses may be used alone or two or more types thereof may be mixed.

The growth temperature is, for example, in the range of 950 to 1400° C. Incidentally, before placing the substrate in the chamber, the substrate 10 is subjected to a predetermined treatment such as washing. The washing of the substrate 10 is performed for removing a natural oxide film formed on the surface of the Si substrate. The natural oxide film is removed using, for example, 1% DHF. After removing the natural oxide film, the substrate 10 is washed with pure water. After washing, the substrate 10 is placed in the vacuum chamber.

The method for epitaxially growing the 3C-SiC layer is not limited to CVD. The epitaxial growth may be performed using a vacuum vapor deposition method such as MBE (Molecular Beam Epitaxy).

Figure 3:
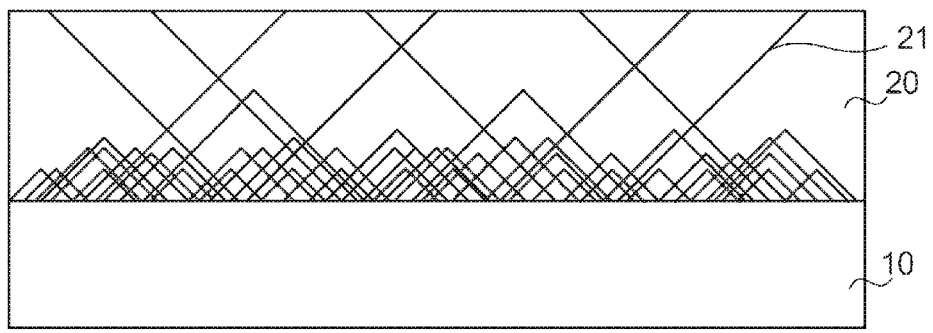
FIG. 3 shows a state after Step S2.

FIG. 3 shows a state after Step S2. Many crystal defects formed at the boundary surface between the SiC epitaxial layer 20 and the substrate 10 extend in the [111] direction. Some of these crystal defects are associated with other crystal defects and thereby are annihilated as the SiC epitaxial layer 20 is grown.

FIG. 2 is referred to again. In Step 3, the SiC epitaxial layer 20 is oxidized. The SiC epitaxial layer 20 is oxidized by, for example, thermal oxidation. The thermal oxidation is dry thermal oxidation performed in an oxygen ($O_2$) atmosphere or wet thermal oxidation performed in an oxygen and steam ($O_2+H_2O$) atmosphere.

The conditions for the oxidation are determined according to the thickness of the substrate 10, the thickness of the SiC epitaxial layer 20, the thickness of the SiC epitaxial layer 30, and the like. One purpose of this oxidation is to compensate the bowing of the epitaxial substrate. The bowing of the epitaxial substrate is determined by the thickness of the substrate 10 and the thickness of the SiC epitaxial layer, and therefore, the degree of the oxidation, that is, the conditions for the oxidation are determined according to the thickness of these members. The thermal oxidation is performed, for example, at 1100 to 1200° C. for 5 to 300 minutes.

Figure 4:
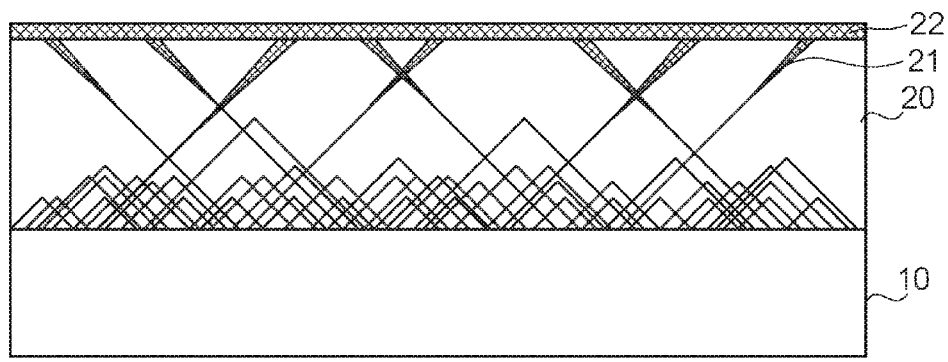
FIG. 4 shows a state after Step S3.

FIG. 4 shows a state after Step S3. Oxygen atom 22 are diffused on the surface of the SiC epitaxial layer 20 and through the crystal defects. Therefore, the oxide film 21 is formed on the surface of the SiC epitaxial layer 20 and also along the crystal defects. The oxide film has an effect of expanding the volume of the 3C-SiC epitaxial layer, and therefore has an effect of generating stress in the opposite direction from the internal stress of the substrate (the Si substrate and the SiC epitaxial substrate) to ease the internal stress. That is, by the oxide film, stress is generated in the direction of compensating the bowing of the substrate. Therefore, by controlling the thickness of the oxide film according to the bowing degree of the substrate, the bowing degree of the substrate can be reduced to almost zero. In the example shown in FIG. 4, the oxide film 21 is formed up to the vicinity of the center in the thickness direction of the SiC epitaxial layer 20. However, as described above, the oxidation degree is controlled according to the bowing degree of the substrate, and therefore, in some cases, oxidation is performed up to the vicinity of the boundary surface between the SiC epitaxial layer and the Si substrate, but in other cases, oxidation is performed only in the vicinity of the surface of the SiC epitaxial layer. The bowing degree of the substrate is estimated based on the conditions such as the thickness of the Si substrate and the thickness of the SiC epitaxial layer.

FIG. 2 is referred to again. In Step 4, the oxide film 21 on the surface of the SiC epitaxial layer 20 is removed. In the removal of the oxide film 21, for example, dry etching, wet etching, or CMP (Chemical Mechanical Polishing) is used. In the wet etching, for example, DHF is used.

Figure 5:
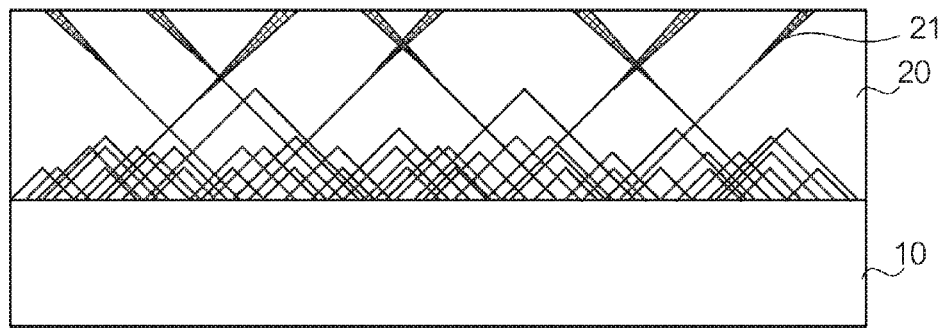
FIG. 5 shows a state after Step S4.

FIG. 5 shows a state after Step S4. By the above-described etching or CMP, the oxide film 21 on the surface of the SiC epitaxial layer 20 is removed. However, the oxide film 21 formed along the crystal defects within the SiC epitaxial layer 20 is not removed and is left therein.

FIG. 2 is referred to again. In Step 5, further a 3C-SiC epitaxial layer (SiC epitaxial layer 30) is grown on the SiC epitaxial layer 20. The method and conditions for the epitaxial growth of the SiC epitaxial layer 30 are the same as or different from those for the SiC epitaxial layer 20.

First, epitaxial growth proceeds from a portion where the oxide film 21 is not formed (a portion where crystal defects are not formed) in the surface of the SiC epitaxial layer 20. On the oxide film 21, an epitaxial layer is not grown at first. However, as the growth of the SiC epitaxial layer 30 proceeds, the growth in the lateral direction proceeds from a portion where crystal defects are not formed, and a continuous epitaxial layer is formed. Here, the SiC epitaxial layer 30 is grown by using the surface of the SiC epitaxial layer 20 as a template, and therefore, a crystal having high quality with few crystal defects is formed.

As described above, according to this embodiment, it is not necessary to form a special pattern on a Si substrate. That is, the bowing of an epitaxial substrate can be reduced without using a photolithographic process. Further, an epitaxial layer having higher quality can be formed.

What is claimed is:

1. A 3C-SiC epitaxial substrate, comprising:
   a Si substrate;
   a buffer layer formed in the Si substrate by a carbonization treatment;
   a first 3C-SiC epitaxial layer formed on the buffer layer; and
   a second 3C-SiC epitaxial layer formed on the first 3C-SiC epitaxial layer,
   an oxide film being formed in a crystal defect of the first 3C-SiC epitaxial layer, wherein
   a density of the crystal defect gradually decreases in a direction toward an interface between the first 3C-SiC epitaxial layer and the second 3C-SiC epitaxial layer, and
   the crystal defect includes a plurality of crystal defects that extend from a surface of the buffer layer to the interface between the first 3C-SiC epitaxial layer and the second 3C-SiC epitaxial layer, and are inclined with respect to the surface of the Si substrate.

2. The 3C-SiC epitaxial substrate according to claim 1, wherein the Si substrate is a Si(100) substrate.

* * * * *